United States Patent [19]

Shimoda

[11] Patent Number: 5,701,602

[45] Date of Patent: Dec. 23, 1997

[54] FREQUENCY CONTROL APPARATUS FOR BASE STATION IN SATELLITE COMMUNICATION SYSTEM

[75] Inventor: Hiromi Shimoda, Tokyo, Japan

[73] Assignee: NEC Corporation, Tokyo, Japan

[21] Appl. No.: 220,024

[22] Filed: Mar. 30, 1994

[30] Foreign Application Priority Data

Mar. 31, 1993 [JP] Japan .................. 5-098549

[51] Int. Cl.⁶ .................................. H04B 1/16
[52] U.S. Cl. ................... 455/260; 455/264; 455/265
[58] Field of Search .................... 455/3.2, 20, 62, 455/75, 76, 56.1, 118, 131, 136, 164.1, 164.2, 165.1, 180.3, 182.1, 182.2, 183.1, 183.2, 190.1, 196.1, 208, 260, 265, 313, 318, 323, 324, 334, 314; 370/121; 375/344; 331/14, 17, 25, 1 A; 327/105

[56] References Cited

U.S. PATENT DOCUMENTS

| | | | |
|---|---|---|---|
| 3,623,098 | 11/1971 | Jones et al. | 375/344 |
| 3,628,155 | 12/1971 | Muzzi | 455/313 |
| 3,939,424 | 2/1976 | Shimizu et al. | 455/265 |
| 4,061,979 | 12/1977 | Walker et al. | 455/265 |
| 4,472,817 | 9/1984 | Poklemba et al. | 375/344 |
| 4,602,225 | 7/1986 | Miller et al. | 455/76 |
| 4,608,710 | 8/1986 | Suguira | 455/3.2 |
| 4,849,993 | 7/1989 | Johnson et al. | 375/376 |
| 4,896,336 | 1/1990 | Henely et al. | 375/344 |
| 4,980,899 | 12/1990 | Troost et al. | 375/376 |
| 5,046,124 | 9/1991 | Wu et al. | 455/265 |
| 5,093,930 | 3/1992 | Kasperkovitz | 455/260 |
| 5,128,632 | 7/1992 | Erhart et al. | 331/25 |
| 5,335,364 | 8/1994 | Heinonen | 455/76 |

FOREIGN PATENT DOCUMENTS 2-246565  10/1990  Japan .

*Primary Examiner*—Nguyen T. Vo
*Attorney, Agent, or Firm*—Sughrue,Mion,Zinn,Macpeak & Seas, PLLC

[57] ABSTRACT

A frequency control apparatus for compensating frequency fluctuation in an input received signal from a satellite station of a satellite communication system, comprises a PLL arrangement for generating a frequency converting signal in response to the frequency fluctuation in the input received signal, a mixer for mixing the input received signal and the frequency converting signal to deliver a resultant output signal, and a control circuit for designating a predetermined signal as the frequency converting signal when the PLL arrangement becomes a phase-unlocked state.

6 Claims, 4 Drawing Sheets

FREQUENCY CONTROL APPARATUS FOR BASE STATION IN SATELLITE COMMUNICATION SYSTEM

BACKGROUND OF THE INVENTION

The present invention relates to a frequency control apparatus and, more particularly, to a frequency control apparatus for a base station in a satellite communication system. A satellite communication system is equipped with a satellite station and a base station on the earth. Further, in general, a transponder in the satellite station is not so good in frequency stability and, thus, a carrier frequency therefrom is fluctuated in a relatively long period. Therefore, a frequency control apparatus should be provided in the base station in order to compensate such frequency fluctuation of the transponder in the satellite station.

PRIOR ART

In general, a prior art frequency control apparatus performs a frequency control by utilizing a mixer. For example, a frequency control apparatus of this type using a mixer is disclosed in Japanese Laid-open Patent Application No. 2-246565 (1990).

FIG. 1 shows a conventional frequency control apparatus of this type.

In FIG. 1, a received signal is supplied to a mixer 1. An output of the mixer 1 is distributed by a distributor 2 and a pilot signal in the output is phase-compared in a phase comparator (dectector) 3 with an output signal of a reference oscillator 4. A phase error voltage which is a phase difference therebetween is analog-to-digital converted in an A/D converter 5 and then integrated in an integration circuit in a controller 6. Further, the integration result is digital-to-analog converted in a D/A converter 7 and then supplied to a voltage controlled crystal oscillator (VCXO) 8 as a control voltage. From the VCXO 8, a frequency converting signal having frequency which is proportional to the control voltage is output.

With such construction, a PLL circuit is formed by the phase comparator 3, the reference oscillator 4, the A/D converter 5, the controller 6, the D/A converter 7 and the VCXO 8 and a continuous operation is performed such that the phase error voltage of the phase comparator 3 becomes minimum by changing the output frequency of the mixer 1 by a change of oscillation frequency of the VCXO 8. In this conventional frequency control apparatus, a synchronization detector 9 is further provided to detect whether or not the phase error voltage is zero, that is, whether the PLL circuit is locked or not. When it is not locked (unlocked) such as immediately after a power source of the device is turned on or when the pilot signal is cut off, the synchronization detector 9 delivers a signal indicating the unlocked state to the controller 6. Thus, the controller 6 operates to continuously change (sweep) an output data to the D/A converter 7 in order to acquire the pilot signal.

An operation of the PLL circuit from the unlocked state to the locked state will be described with reference to FIG. 1 and FIG. 2 showing a timing chart.

As shown in FIG. 1, the input signal to the phase comparator 3 and the oscillation output of the reference oscillator 4 are represented by $f_V$ and $f_R$, respectively. Referring to FIG. 2, when the input signal $f_V$ is delayed with respect to the oscillation output $f_R$ ($T_1$), an output PD having wave height and pulse width corresponding to a phase difference therebetween is output from the phase comparator 3. The output PD is converted into a digital value by the A/D converter 5 and then input to the controller 6. Further, a signal LD having pulse width corresponding to the phase difference between the input signal $f_V$ and the oscillation output $f_R$ is input to the synchronization detector 9. The synchronization detector 9 integrates the signal LD and it judges as the unlocked state when the integrated value is larger than a predetermined threshold level and as the locked state when it is smaller and outputs the judgement to the controller 6. Since the cases $T_1$ and $T_2$ are judged as the unlocked state, the output data from the controller 6 is changed continuously.

On the other hand, when the input signal $f_V$ is advanced with respect to the oscillation output $f_R$ as in the case $T_3$, an output PD having wave height and pulse width corresponding to a phase difference therebetween is output from the phase comparator 3. However, in this case, the waveform is inverted since the phase is advanced. Also, a signal LD having pulse width corresponding to the phase difference between the input signal $f_V$ and the oscillation output $f_R$ is supplied to the synchronization detector 9.

When the input signal $f_V$ and the oscillation output $f_R$ are in phase as in the case $T_4$, pulse widths of the output PD and the signal LD become values close to zero. Thus, the synchronization detector 9 judges it as the locked state and, as a result, the output data supplied from the controller 6 to the D/A converter 7 becomes fixed.

As mentioned above, when the PLL circuit is in the unlocked state, a control is performed to put it in the locked state by changing the output of the D/A converter 7, that is, the oscillation frequency of the VCXO 8.

However, in the conventional frequency control apparatus, in order to catch a pilot signal immediately after the power source is turned on or re-catch a pilot signal which is lost during a normal operation, the frequency of the main output signal therefrom is drastically changed. Therefore, there is a serious problem in that a communication line can not be maintained.

SUMMARY OF THE INVENTION

It is therefore an object of the present invention to provide a frequency control apparatus capable of maintaining a communication line at a time of catching a pilot signal.

According to the present invention, there is provided a frequency control apparatus for controlling frequency of an input signal, comprising: a first mixer for mixing the input signal and a first frequency converting signal to deliver a first frequency-converted signal; a first oscillator for generating the first frequency converting signal in response to a first control signal; a phase detector for detecting a phase difference between the first frequency-converted signal and a reference signal, the phase difference corresponding to the first control signal; a synchronization detector responsive to the phase difference for detecting a phase-locked state or a phase-unlocked state; a second mixer for mixing the input signal and a second frequency converting signal to deliver a second frequency-converted signal; a second oscillator for generating the second frequency converting signal in response to a second control signal; and a selecting means responsive to an output of the synchronization detector for selecting the phase difference or a preset signal to deliver the second control signal, the present signal being a predetermined initial value for a power-on timing or a previous value of the first control signal before the phase-unlocked state, wherein the second frequency converted signal is delivered as a resultant output.

DESCRIPTION OF THE EMBODIMENT OF THE INVENTION

Figure 1:
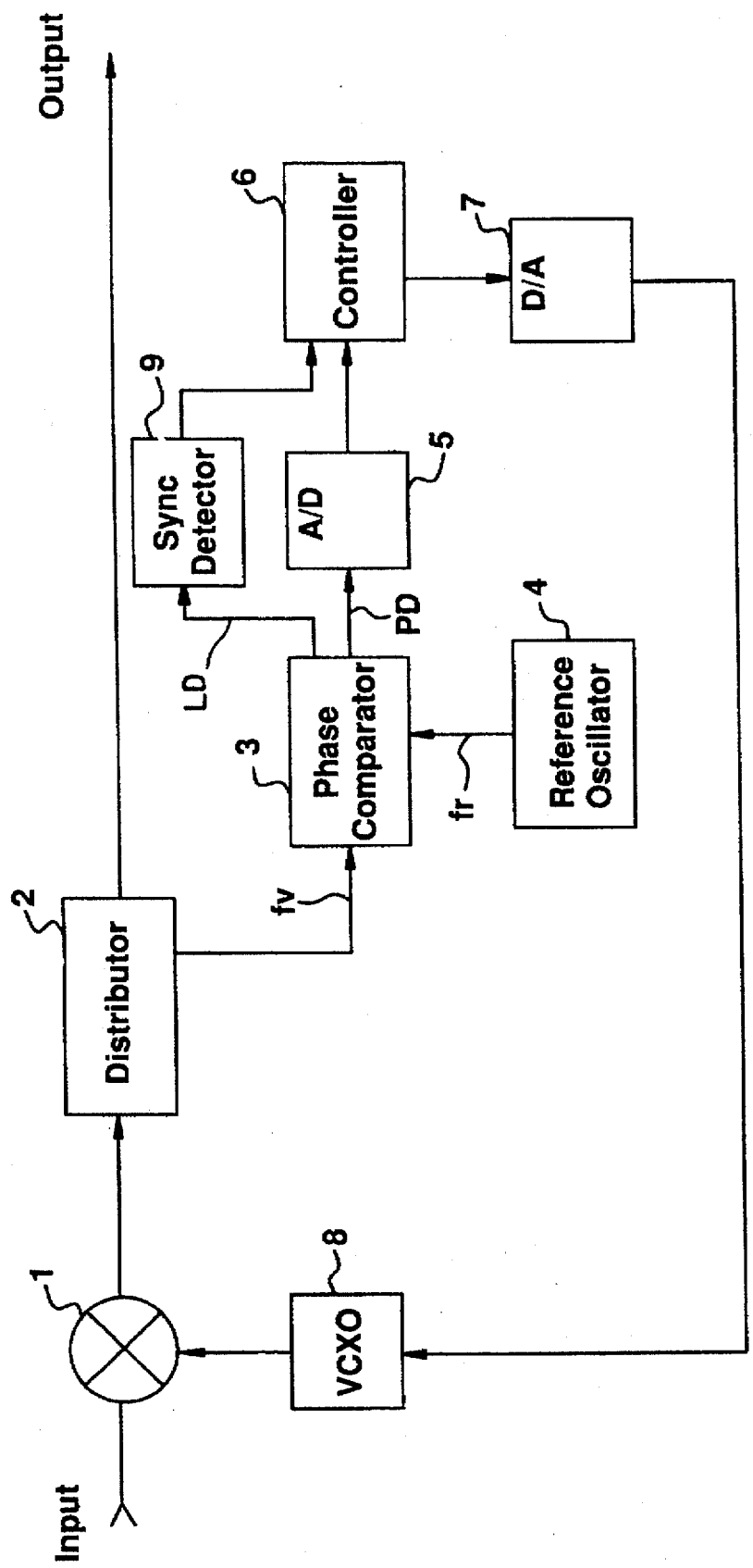
FIG. 1 is a schematic diagram of a conventional frequency control apparatus.
Figure 2:
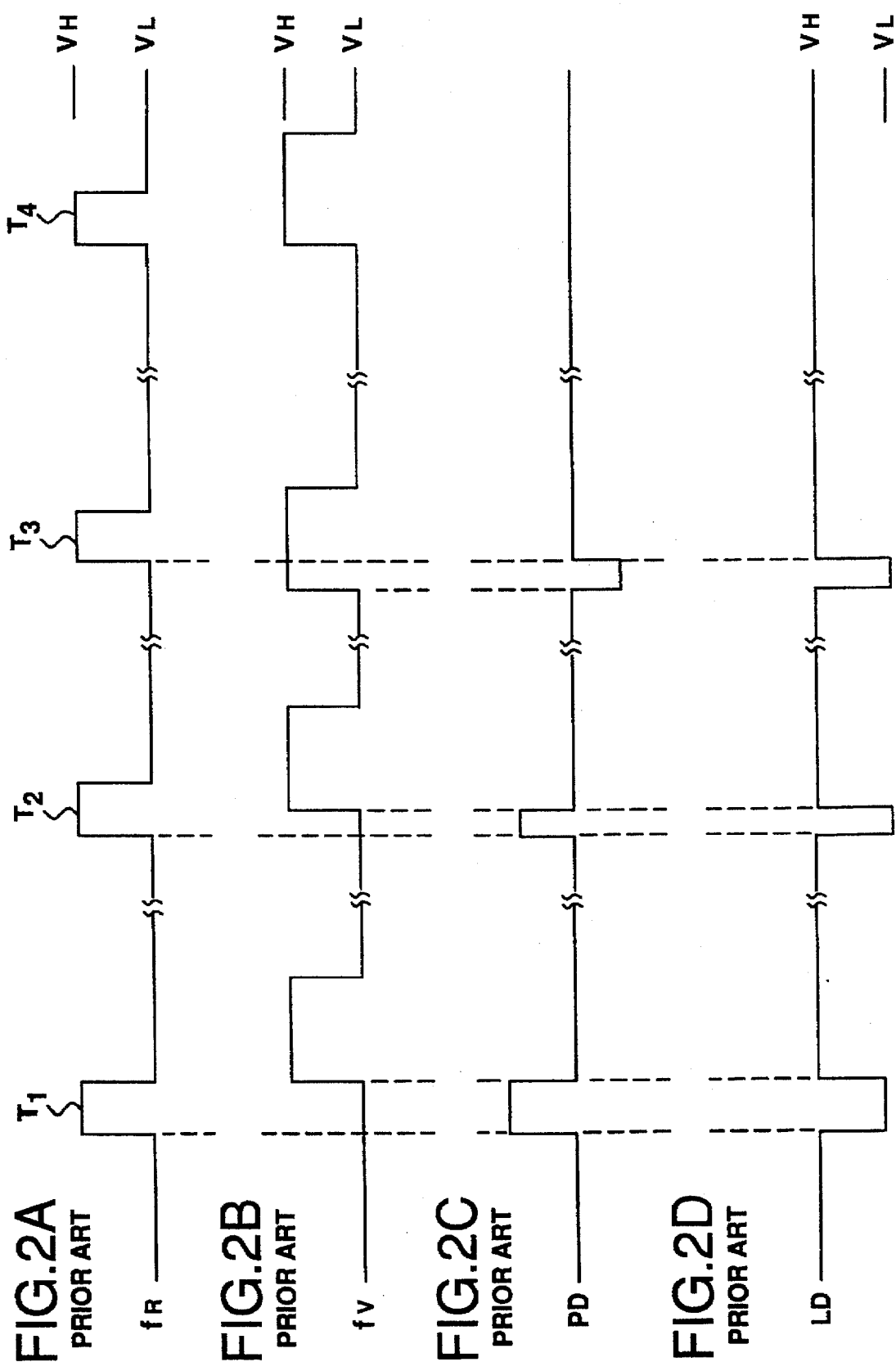
FIGS. 2(a–d) shows a timing chart of the conventional frequency control apparatus.
Figure 3:
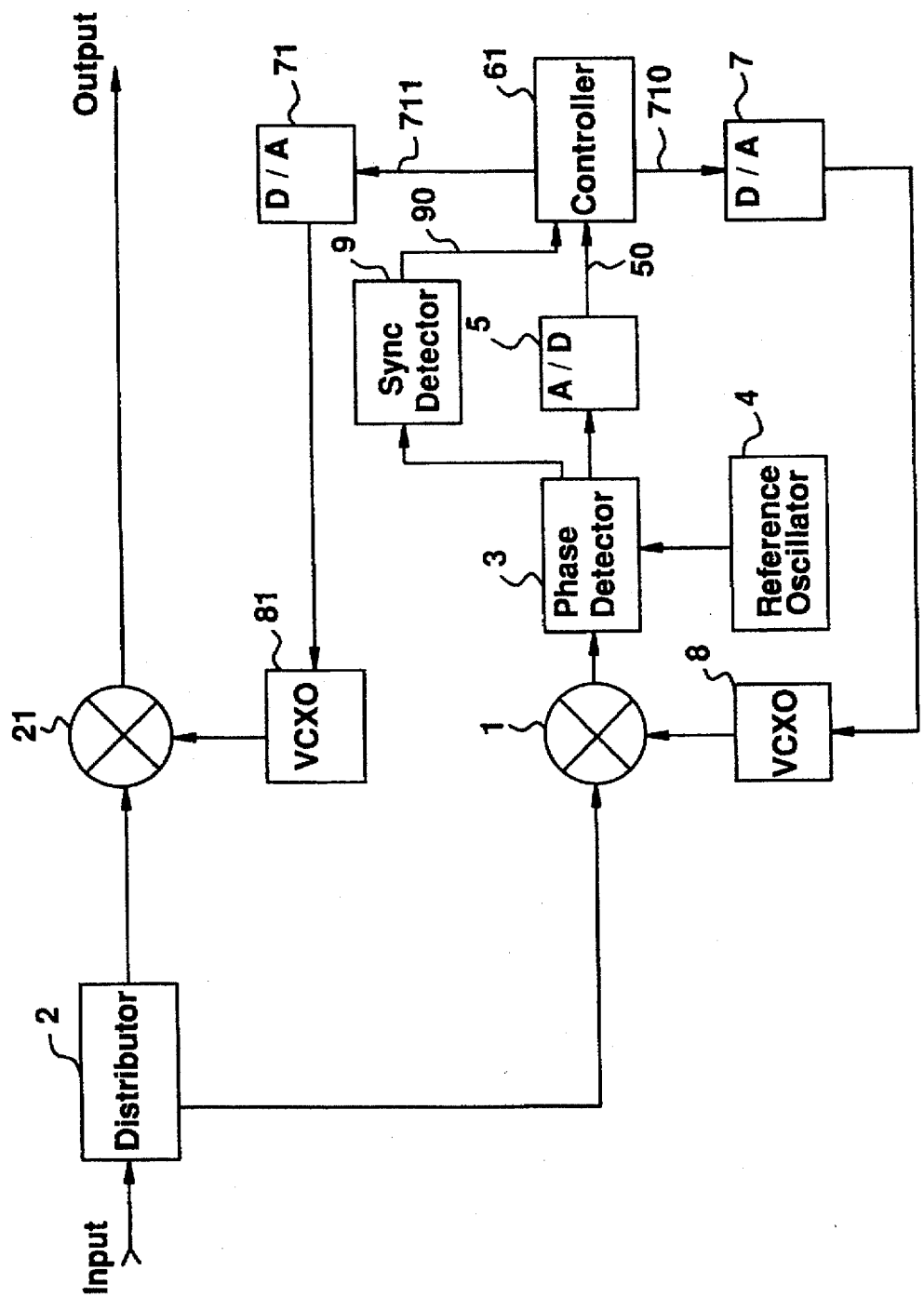
FIG. 3 is a block diagram of an embodiment according to the present invention.

FIG. 3 shows a construction of a frequency control apparatus according to the present invention, in which components corresponding to those shown in FIG. 1 are depicted by the same reference numerals. In the embodiment, a PLL circuit for catching a pilot signal and a circuit for converting the frequency are provided separately, unlike the conventional apparatus. That is, a pilot signal is caught by the PLL circuit comprising a mixer 1, a phase comparator detector 3, a reference oscillator 4, a controller 61 and a VCXO 8, etc., and the frequency conversion is performed by the controller 61, a D/A converter 71, a VCXO 81 and a mixer 21.

The controller 61 of the invention has the functions of sending a predetermined data to the D/A converter 71 at an initial pilot signal catching operation and of holding previous data and sending it to the D/A converter 71 when the pilot signal is lost. A detailed construction of the controller 61 having these functions will be described with reference to FIG. 4.

Figure 4:
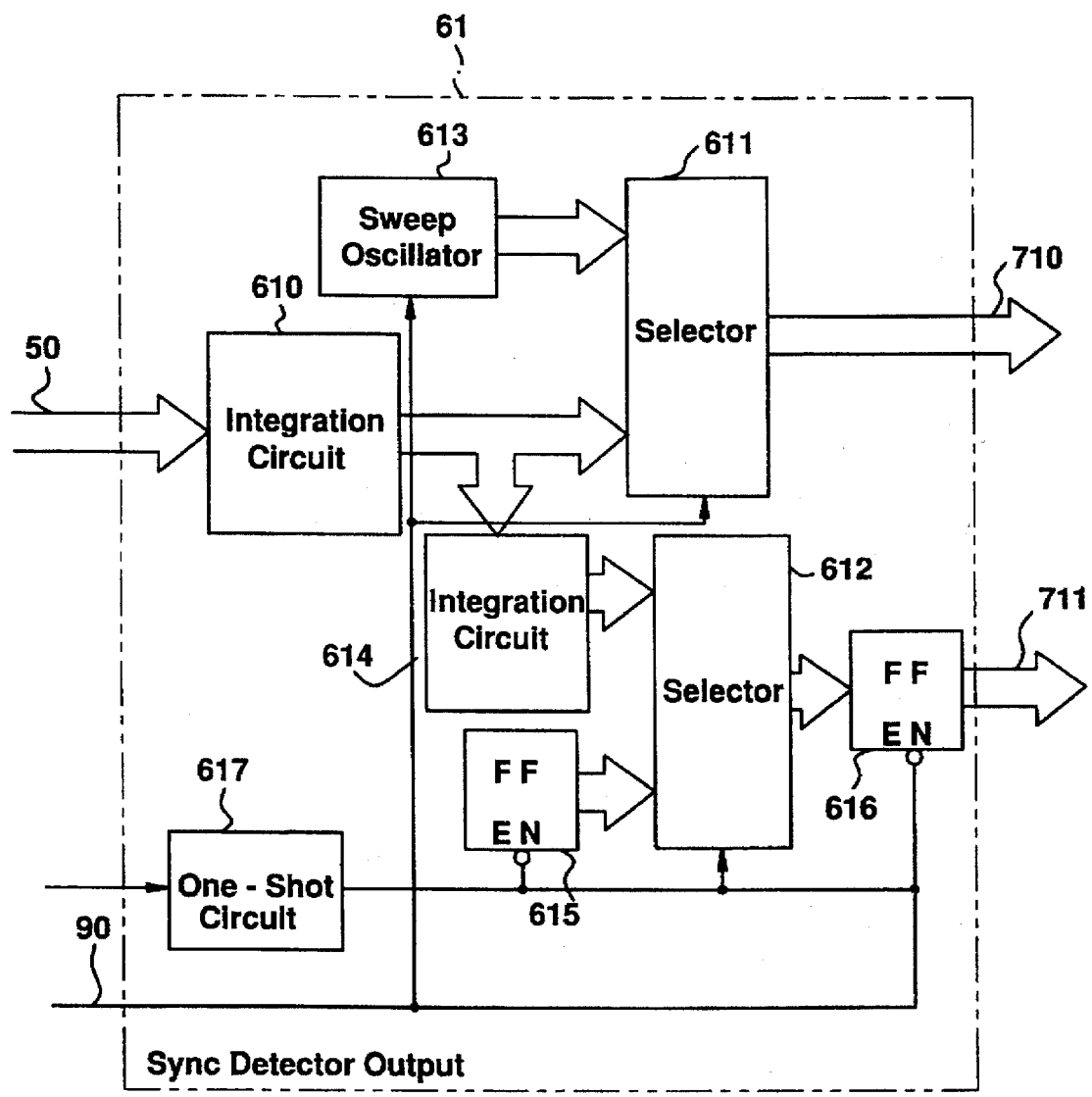
FIG. 4 is a detailed block diagram of a controller in the embodiment of FIG. 3.

In FIG. 4, the controller 61 includes an integration circuit 610 for integrating data 50 from the A/D converter 5, a selector 611 for selectively sending the integration output or an output of a sweep oscillator circuit 613, and an integration circuit 614 for further integrating the integration output from the integration circuit 610. Further, the controller 61 includes another selector 612 for selectively sending the output of the integration circuit 614 or an output of a flip-flop (FF) circuit 615, a one-shot circuit 617 for supplying a one-shot pulse to the FF circuit 615 and the selector 612 when the power source of the device is turned on, and an FF circuit 616 for holding the output of the selector 612.

In this construction, a one-shot pulse having a constant pulse width is sent from the one-shot circuit 617 in response to a power source turn-on signal immediately after the power source is turned on. Thus, a predetermined data is loaded in the FF circuit 615 thereby and its output is selected by the selector 612 and output. Then, the data is held by the FF circuit 616 and output as data 711. Although not shown, the FF circuits 615 and 616 are supplied with a clock signal. In this case, the PLL circuit is not locked and an output 90 from the synchronization detector 9 indicates the PLL circuit not locked. Therefore, data whose value is continuously changed is sent from the sweep oscillator circuit 613, selected in the selector 611 and output to the D/A converter 7 as data 710.

As mentioned, immediately after the power source of the device is turned on, data 710 is input to the D/A converter 7 to form the PLL circuit and the operation for catching of pilot signal is performed. Simultaneously therewith, the output data 711 held in the FF circuit 616 is input to the D/A converter 71 to send a signal for frequency conversion and the communication line is maintained. The data held in the FF circuit 616 is the data loaded in the FF circuit 615 as mentioned above, which may be a data having an intermediate value of data width converted in the D/A converter 7.

On the other hand, when the pilot signal is lost after the PLL circuit is once locked, the following operation is performed. In a case where the PLL circuit is in the locked state, the integration output of the integration circuit 610 is selected in the selector 611 and sent as the data 710. Further this integration output is further integrated in the integration circuit 614 and the further integrated data is selected in the selector 612, held temporarily in the FF circuit 616 and sent out as the data 711. When the pilot signal is lost in this locked state and it becomes unlocked thereby, the state is detected by the synchronization detector 9 and thus the level of the output 90 is changed. Therefore, the data 711 of the FF circuit 616 is held as it is and data corresponding to the previous locked state is output continuously. Further, sweep-changed data is sent from the sweep oscillator circuit 613, selected in the selector 611 and output as the data 710.

Therefore, the data 711 for frequency conversion is input to the D/A converter 71, thereby maintaining the communication line. On the other hand, the data from the sweep oscillator circuit 613 is input through the D/A converter 7 to the PLL circuit for catching the pilot signal, again. When the pilot signal is caught and it becomes locked, again, the synchronization detector 9 detects this and the holding state of the FF circuit 616 is released. Simultaneously, the selector 611 is switched to select the data from the integration circuit 614.

In the embodiment, a time constant of the integration circuit 614 is set to be larger than that of the integration circuit 610. Namely, the changing speed of the data 711 is lowered in comparison with that of the data 710 by further integrating the integration output of the integration circuit 610 and delaying it, so that the change does not affect a demodulator connected subsequently.

Returning to FIG. 3, in the embodiment having construction mentioned above, the signal including the pilot signal from the input terminal is branched by the distributor 2. The one branched signal is input to the mixer 1 and frequency-converted. The output of the mixer 1 and the output signal of the reference signal oscillator 4 are supplied to the phase comparator 3 and converted into a phase error voltage proportional to a phase difference therebetween. The phase error voltage is converted into a digital value by the A/D converter 5 and supplied to the controller 61. The integration processing is performed in the controller 61 and the result is output to the D/A converter 7 by which it is converted into a control voltage. The control voltage is input to the VCXO 8 and a signal having frequency proportional to the level of the control voltage is input to the mixer 1. Thus, frequency change of the VCXO 8 causes frequency of the output of the mixer 21 to change continuously such that the phase error voltage of the phase comparator 3 becomes minimum. The above operations constitutes the pilot signal catching processing.

The other branched signal from the distributor 2 is input to the mixer 21 and, frequency-converted thereby to output the converted output from the output terminal. After the above-mentioned processing of the pilot signal catching is completed, the controller 61 outputs a value equal to the digital value output to the D/A converter 7 to the D/A converter 71 in which it is converted into the control voltage. The control voltage is input to the VCXO 81 from which a signal having frequency proportional to the control voltage is input to the mixer 21. Frequency change of the VCXO 81 causes frequency change of the output of the mixer 21 to change continuously, so that a required frequency control is performed. In this embodiment, it is assumed that the D/A converters 7 and 71 have the same characteristics and the VCXOs 8 and 81 also have the same characteristics.

Although the controller 61 is constituted by a hardware including the integration circuits and the selectors, it should be noted that it is possible to realize the similar functions by a software or firmware including CPU and memories.

As described hereinbefore, the present invention can hold frequency of the main signal delivered from the output terminal when the initial pilot signal is catched or the pilot signal is recatched. Further, by changing the frequency conversion speed in the main signal the demodulator connected subsequently is not affected after the pilot signal is caught, while keeping the communication line. Accordingly, there is an remarkable effect to improve the pilot signal catching processing.

What is claimed is:

1. A frequency control apparatus for controlling frequency of an input signal, comprising:

a first mixer for mixing said input signal and a first frequency converting signal to deliver a first frequency-converted signal;

a first oscillator for generating said first frequency converting signal in response to a first control signal;

a phase detector for detecting a phase difference between said first frequency-converted signal and a reference signal, said phase difference corresponding to said first control signal;

a synchronization detector responsive to said phase difference for detecting a phase-locked state or a phase-unlocked state;

a second mixer for mixing said input signal and a second frequency converting signal to deliver a second frequency-converted signal;

a second oscillator for generating said second frequency converting signal in response to a second control signal; and a selecting means responsive to an output of said synchronization detector for selecting said phase difference or a preset signal to deliver said second control signal, wherein said first and second control signals are delivered as a resultant output.

2. A frequency control apparatus as claimed in claim 1, wherein said preset signal is a predetermined initial value or a delayed phase difference produced by delaying said phase difference.

3. A frequency control apparatus as claimed in claim 2, wherein said predetermined initial value is loaded when a power supply is applied.

4. A frequency control apparatus as claimed in claim 2, said selecting means further comprising:

a first selector for selecting said phase difference or a sweeping signal to deliver said first control signal, an integrating circuit for integrating said phase difference to produce said delayed phase difference, and a second selector for selecting said delayed phase difference or said predetermined initial value to deliver said second control signal.

5. A frequency control apparatus as claimed in claim 4, wherein said selecting means further includes:

a holding circuit for holding an output of said second selector to deliver said second control signal, said holding circuit holding the output of said second selector when said synchronization detector detects said phase-unlocked state.

6. A frequency control apparatus as claimed in claim 4, said predetermined initial value is substantially set to an average of said sweeping signal.

* * * * *